United States Patent
Nicholson et al.

(10) Patent No.: US 7,564,663 B2
(45) Date of Patent: Jul. 21, 2009

(54) ACTIVE LIMITER WITH INTEGRATED SENSOR

(75) Inventors: Dean Nicholson, Windsor, CA (US); Eric R. Ehlers, Santa Rosa, CA (US); Stephen Westerman, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 320 days.

(21) Appl. No.: 11/139,853

(22) Filed: May 26, 2005

(65) Prior Publication Data

US 2006/0267662 A1 Nov. 30, 2006

(51) Int. Cl.
*H02H 9/00* (2006.01)
*H02H 3/20* (2006.01)
*H02H 9/04* (2006.01)
*H02H 3/22* (2006.01)
*H02H 1/04* (2006.01)
*H02H 9/06* (2006.01)
*H02H 7/12* (2006.01)

(52) U.S. Cl. .................... 361/56; 361/91.1; 361/91.5; 361/111; 361/119; 327/309

(58) Field of Classification Search .................. None
See application file for complete search history.

(56) References Cited

U.S. PATENT DOCUMENTS

| | | | |
|---|---|---|---|
| 4,930,036 A | 5/1990 | Sitch | |
| 5,281,925 A * | 1/1994 | Hulick | ............... 330/296 |
| 5,301,081 A * | 4/1994 | Podell et al. | ............... 361/56 |
| 6,635,930 B1 | 10/2003 | Hauptmann et al. | |
| 6,762,647 B1 * | 7/2004 | Apel | ............... 330/279 |
| 6,836,187 B2 * | 12/2004 | Jansen et al. | ............... 330/279 |
| 6,884,950 B1 | 4/2005 | Nicholson et al. | |
| 7,148,748 B2 * | 12/2006 | Apel | ............... 330/279 |
| 2004/0140849 A1 * | 7/2004 | Ikeda | ............... 330/110 |
| 2005/0136865 A1 * | 6/2005 | Dupuis | ............... 455/127.1 |

OTHER PUBLICATIONS

GB Search Report under Section 17 dated Sep. 19, 2006.

* cited by examiner

*Primary Examiner*—Stephen W Jackson
*Assistant Examiner*—Dharti H Patel

(57) ABSTRACT

An integrated circuit includes a first RF port and a second RF port. A limiter section is disposed between the first RF port and the second RF port and a detector section coupled to an RF signal path between the first RF port and the second RF port configured to detect a power level of an input signal, and coupled to the limiter section.

16 Claims, 3 Drawing Sheets

ACTIVE LIMITER WITH INTEGRATED SENSOR

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Many electronic circuits and components can be damaged if exposed to a high-power input signal or pulse. For example, a diode, transistor, or micro-electro-mechanical system ("MEMS") switch can be damaged or destroyed by a high-power radio-frequency ("RF") signal, an electro-static discharge ("ESD") event, or in general any sufficiently large form of electrical overstress. Various techniques are used to avoid such damage.

Passive limiters are used in a number of circuits, such as at the input to microwave and RF instrumentation and components, to limit the amount of power at the output of the passive limiter. Passive limiters are typically diode-based and are designed to operate so that the limiter starts attenuating at a selected RF input signal level, and increases attenuation as the RF input signal level increases. The components in a passive limiter, which are frequently diodes, transition from one conductive state to another according to the RF signal power level, hence the term "passive" limiter. Generally, the power level at the output of the passive limiter does not rise above a maximum value, regardless of the power at the input to the limiter, as long as the input power does not exceed the power-handling ability of the passive limiter.

However, a disadvantage of passive limiters is that a tradeoff is made between the power level at which the passive limiter starts attenuating an input signal and the amount of distortion that a passive limiter adds to the input signal. For example, in order to avoid damaging a low-noise amplifier that may be selectively switched into the input path of a microwave test instrument, a maximum power of one watt is desired. However, because the same microwave test instrument makes measurements up to a power level of one watt (e.g. when the low-noise amplifier is not in the input signal path), the threshold power level of the passive attenuator is set to two watts or more to avoid the distortion that would otherwise occur on one-watt input signals if the threshold power level was set lower. Even with the threshold power level set to two watts, there can be significant distortion added to a one-watt input signal because of the "soft" way the limiter turns on. The tradeoff between power limiting threshold and distortion is becoming more important with more complex modulation formats because complex modulation formats are more susceptible to distortion caused by passive limiters, particularly at high signal power levels.

Some limiters have their limiting threshold (i.e. the threshold power level at which the limiter starts attenuating) set by an external voltage. Examples of such limiters have been built as integrated circuits ("ICs"). An IC limiter may be used in a variety of applications by selecting the appropriate external applied voltage to provide the desired limiting threshold. Unfortunately, this style of limiter still adds significant distortion when used in a frequency domain application at high power levels.

Another technique that has been used is active limiting. Active power limiting is the process of actuating a limiter circuit by an external control voltage or current according to a detected input power level. Active power limiters have been built using distributed components (e.g. limiter ICs and diodes) on a printed circuit board ("PCB") or other substrate. In a particular example, current draw through the diodes of one section of a distributed limiter is monitored and used to infer RF overpower conditions. Information gained by sensing the current is used to control a switch that opens a mechanical relay, thus preventing damage to downstream components.

The active limiter uses a passive diode GaAs IC limiter followed by a number of passive diodes in surface mount technology ("SMT") packages. The SMT diodes and GaAs IC limiter are mounted on a PCB to both sense and limit RF overpower conditions and ESD pulses, as well as to control a mechanical relay. These components protect downstream circuits from power up to 50 watts.

However, this active limiter is physically large due to the number of distributed components. This active limiter has a maximum frequency of operation around 6 GHz, due mainly to the mechanical relay. Furthermore, this active limiter will only reliably limit high-power signals a limited number of times before contacts of the mechanical relay are degraded.

Therefore, an active limiter that operates at higher frequencies, is physically smaller than conventional active limiters, and can be set to its power limiting state more quickly is desired.

BRIEF SUMMARY OF THE INVENTION

An integrated circuit includes a first RF port and a second RF port. A limiter section is disposed between the first RF port and the second RF port and a detector section coupled to an RF signal path between the first RF port and the second RF port configured to detect a power level of an input signal, and coupled to the limiter section.

DETAILED DESCRIPTION OF THE EMBODIMENTS

Figure 1A:
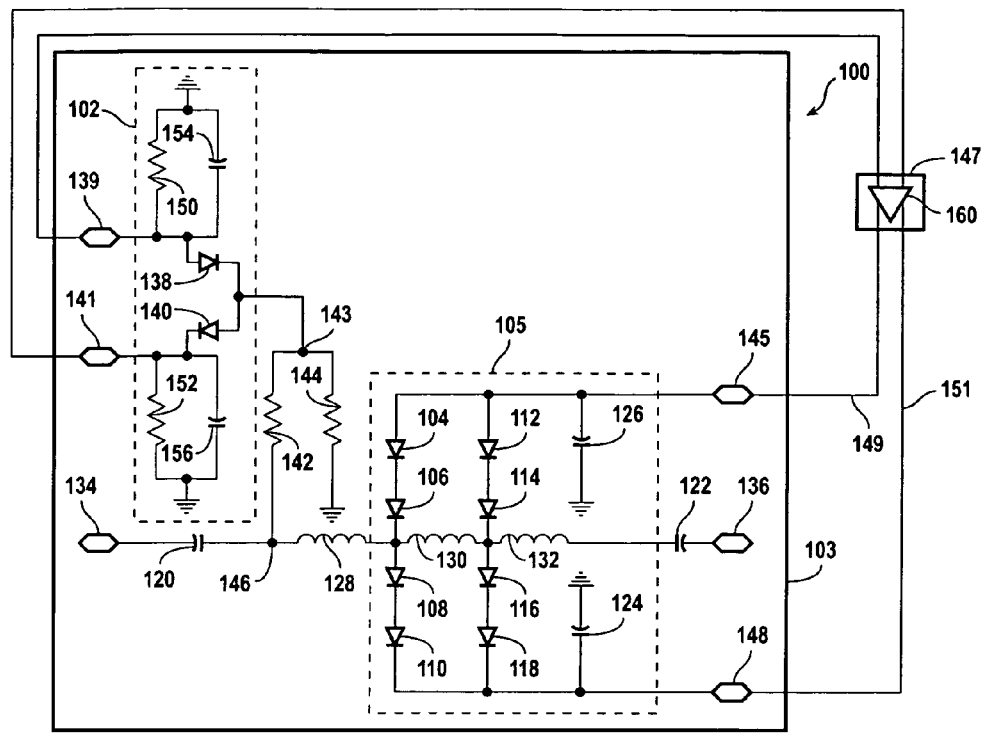
FIG. 1A shows a circuit diagram of an active limiter according to an embodiment of the invention.

FIG. 1A shows a circuit diagram of an active limiter 100 according to an embodiment of the invention. The active limiter 100 includes a detector section 102 integrated on an IC 103 with a plurality of biasable switch devices forming a limiter section 105. In this embodiment, diodes 104, 106, 108, 110, 112, 114, 116, 118 such as PIN diodes, Schottky diodes or modified barrier diodes, are used as biasable switch devices. In alternative embodiments, other biasable switch devices, such as field-effect transistors ("FETs"), bipolar junction transistors (BJTs), or photoconductive devices are used. The diodes 104, 106, 108, 110, 112, 114, 116, 118 are capable of limiting electrical overstress events, such as high RF powers and ESD events, with high reliability in their high-attenuation state, and are able to be hot switched (i.e. switched while RF power is applied) for a large number of cycles (typically at least in the billions of cycles). The IC 103 is fabricated on a chip of gallium arsenide (GaAs). Semi-insulating GaAs is particularly desirable because a low-loss fifty-ohm transmission line and very fast diodes can be fabricated using a semi-insulating GaAs substrate. Alternatively, the active limiter 100 is fabricated on a chip of silicon, gallium nitride, or other semiconductor. Silicon nitride has good thermal conductivity and tolerates high-power signals better in some embodiments.

Capacitors 120, 122 provide DC blocking. Capacitors 124, 126 provide good on-chip RF grounds for the diodes 104, 106, 108, 110, 112, 114, 116, 118, and while only two capacitors are shown, more capacitors may also be used. Alternatively, some or all of the RF ground capacitors for the diodes are located off of the IC and connected to the IC by very short bond wires to allow use of chip capacitors, which are relatively inexpensive, provide high capacitance values, and saves space on the high-cost-per-mm$^2$ GaAs IC. In further or alternative embodiments, surface-mount ("SMT") capacitors providing even larger values of capacitance, are added in parallel to the chip capacitors connected by bond wires to the GaAs IC, with appropriate resonance suppressing resistors between capacitors, as needed, in order to allow extended low frequency performance of this device. A combination of on-chip and off-chip capacitors for RF grounding of the diodes is alternatively used.

The diodes are arranged in "stacks" of two diodes per stack. For example, diodes 104, 106 form a diode stack. In alternative embodiments, more or fewer diodes are in each stack, and alternative embodiments have more or fewer stacks. Inductors 128, 130, 132 cooperate with the capacitance of the diodes 104, 106, 108, 110, 112, 114, 116, 118 in their off (reversed bias) state to form a transmission line having a selected characteristic impedance.

The characteristic impedance is typically matched to the characteristic impedance of an input transmission line or device (not shown) that is coupled to a first RF port 134, which will be referred to as the "RF input port" for convenience of discussion, and/or the characteristic impedance of an output transmission line or device (not shown) that is coupled to a second RF port 136, which will be referred to as the "RF output port" for convenience of discussion. Fifty ohms is an example of a common characteristic impedance. The RF ports 134, 136 are impedance-matched to avoid reflecting RF power when the RF power is at a safe level.

The path from the RF input port 134 to the RF output port 136 is generally referred to as the RF signal line or RF signal path. The terms "input port" and "output port" are used solely for convenience of discussion. In one application, the "input" might be connected to the output of a signal generator or other signal source, while in another application the "input" might be connected to the input of a receiver, for example. The diodes 104, 106, 108, 110, 112, 114, 116, 118 limit RF power transmitted through the limiter when the diodes 104, 106, 108, 110, 112, 114, 116, 118 are biased ON by altering the impedance of the signal path through the limiter section. Generally, adding more diode stacks increases the power handling and power limiting characteristics of the limiter section.

The detector 102 includes detector diodes 138, 140 arranged as an antiparallel pair to monitor the level of the RF power or ESD voltage at node 146 (i.e. the input to the limiter section). Arranging the diodes 138, 140 in an antiparallel configuration cancels out even-order harmonics that might otherwise be coupled back onto the RF signal line (node 146), and also doubles the effective voltage available to be delivered to a limiter drive circuit 147.

Detecting the RF power/ESD voltage between the "input" 134 and the limiter section 105 indicates electrical overstress events arriving at the active limiter 100. Alternatively, the RF power/ESD voltage could be detected between the "output" 136 and the limiter section 105. This would provide an indication of the power being coupled to downstream devices. If the limiter section turns on, the latter configuration would not indicate whether the power level has receded to an appropriate level if the limiter remains fully turned on. However, if the limiter section is gradually turned to the low attenuation state after the initial overstress event, checking can be done for a continuing overstress event while still maintaining a safe operating level for the downstream devices. Thus, each configuration has advantages in particular circumstances and the active limiter could be used in either orientation. Integrating the detector section and limiter section on a single IC facilitates using an IC according to some embodiments in either orientation because the short line length combined with the carrier mobility in an GaAs IC avoids standing waves from forming along the RF path up to very high frequencies. In a particular embodiment, the limiter is not symmetrical from front to back. In other words, the limiter diodes are not completely interchangeable. In such an embodiment, the active limiter is typically installed in a selected orientation, e.g. the "input" port is the upstream port.

The detector 102 has two detector outputs 139, 141 that are coupled to the limiter drive circuit 147 to generate limiter drive signals 149, 151, which are coupled to limiter bias input ports 145, 148. In an alternative embodiment, one port of the limiter section is grounded; however, the signal line would then have a DC component equal to ½ of the total voltage biasing the limiter diodes, and additional diodes would typically be added to block the DC component from propagating out of the limiter section. The limiter drive signals 149, 151 forward bias the limiter diodes 104, 106, 108, 110, 112, 114, 116, 118 when an electrical overstress event is detected.

For example, the limiter drive circuit provides a bias voltage of −15 V between the bias input ports 145, 148 to turn the diodes OFF (low attenuation condition), and to provide a bias voltage of typically 0.6 to 0.9V per diode between the bias input ports 145, 148 to turn the diodes ON (high attenuation condition). The switching from ON to OFF happens very sharply, which avoids soft limiting. Biasing the limiter section OFF with a sufficiently high voltage avoids having a high-power RF signal that is below the detector threshold (i.e. a desired high-power signal) from significantly changing the bias point of the diodes. This provides a stable impedance for the RF signal path at higher RF signal levels before the limiter is active.

Resistors 142, 144 form a voltage divider. The voltage at node 143 determines the signal level at the detector diodes 138, 140. The values of the resistors 142, 144 are chosen so that there is sufficient signal strength delivered to the detector diodes 138, 140 wherein there is an electrical overstress event so that the detector diodes 138, 140 turn on quickly, but a low enough power level so that there is negligible distortion added back on the signal line at the maximum unattenuated RF power level where a valid measurement needs to be made. In a particular embodiment, it is desirable to measure RF signals having a power level of about one watt (i.e. to turn on the attenuator section when the RF power level exceeds about one watt), and the values of the resistors 142, 144 are chosen so that the distortion added back on the signal line is less than the maximum distortion allowed for the application.

Resistors 150, 152 provide a load and a DC path to ground for the detector diodes 138, 140. The resistors 150, 152 cooperate with resistors 142, 144 to set the operating points of the detector diodes 138, 140. If resistor 142 has high resistance, resistor 142 also provides attenuation between the detector diodes 138, 140 and node 146 to reduce distortion arising in the detector diodes 138, 140 from coupling onto the signal line. Capacitors 154, 156 provide a low-impedance path to ground for AC current through the detector diodes 138, 140.

It is desirable that the detector section 102 be integrated with the limiter section 105 so that rapid detection of an electrical overstress event is achieved. Shortening the line lengths of the feedback loop from the detector to the active limiter on the IC version, compared to a PCB-type limiter, for example, provides a significant advantage in the ability to set the limiter to its high attenuation state more quickly, and thus better protects downstream circuitry from electrical overstress conditions. Also, a PCB-type limiter uses the start of current draw through its PIN diodes to detect high power RF signals, and this adds distortion at higher signal levels.

Another advantage of keeping the line lengths short between the detector section and the limiter section is that there will be insufficient line length between them to support standing waves between them up to about 20 GHz, or higher frequency, so that the voltage being monitored by the detector is the same voltage as that being applied to the limiter. Having a separate detector section 102, rather than relying on passive limiting, allows the diodes 104, 106, 108, 110, 112, 114, 116, 118 to be rapidly switched from a first biased condition (e.g. high reverse bias) to a second biased condition (e.g. high forward bias).

In comparison, in a conventional passive limiter or an externally-set limiter, the limiting diodes slowly start to turn on as the RF power level or ESD voltage exceeds a threshold value, but are not fully turned on unless the RF power level is sufficiently high. This causes distortion in RF signals above the threshold value and in incomplete limiting between when the diodes start to turn on and when they are fully turned on. This region of operation is commonly referred to as "soft" limiting.

However, active limiters according to embodiments of the invention are operated so that the limiter diodes 104, 106, 108, 110, 112, 114, 116, 118 in a stable reversed biased condition cooperate with the inductors 128, 130, 132 to form a well-behaved transmission line having a selected characteristic impedance over the desired power range. This allows transmitting relatively high-power RF signals along the signal path without significantly changing the operating (i.e. bias) points of the limiter diodes 104, 106, 108, 110, 112, 114, 116, 118. If an electrical overstress event is detected by the detector section 102, the limiter diodes 104, 106, 108, 110, 112, 114, 116, 118 are actively driven to a forward-biased condition, changing the impedance of the signal path and reflecting power so that it is not coupled to the output port 136. This avoids the soft limiting condition, and hence the distortion of desired high-power RF signals, that arises in passive limiters.

The limiter drive circuit 147 includes a differential amplifier 160. When the differential amplifier inputs (i.e. the signals from the detector outputs 139, 141) are sufficiently different in voltage to indicate an electrical overstress event, the outputs 149, 151 of the differential amplifier quickly switch the limiter diodes 104, 106, 108, 110, 112, 114, 116, 118 to a strongly forward-biased, low-impedance condition. This causes most of the incoming signal to be reflected by the limiter section 105, protecting circuits or devices that are connected to the RF output 136, or vice versa.

In a particular embodiment, a latch (not shown) is included in the limiter drive circuit or elsewhere to maintain forward bias (high attenuation state) when an overpower or overvoltage event is detected. Otherwise, the reflected signal can cause a voltage null to occur at the detector when the limiter is actuated, which would appear to the detector as though the overpower condition had passed. In an alternative embodiment, the limiter drive circuit is a comparator that compares a detector output signal against a reference voltage. The reference voltage is generated off-chip and in a particular embodiment is user-selectable so that the limiter turns on at a selectable power level.

The active limiter 100 is returned to a low attenuation state with a user reset signal that sets the limiter drive circuit 147 to reverse bias the limiter diodes. Alternatively, the detector is at the output of the Active Limiter, and after the limiter is turned on, a short wait state occurs which allows time for the overstress condition to be corrected. The bias to the limiter is then gradually changed to reduce the attenuation and continue checking for overstress. If no overstress is found after the limiter bias has been ramped to its low loss condition, normal measurements can again be resumed. If electrical overstress is still present, then the process can be repeated, or the limiter can be left in its high attenuation bias condition. A third embodiment uses a directional detector, such as providing a directional coupler or bridge at essentially node 146 so that the detector section 102 primarily detects signals propagating from the first port 134 to the second port 136.

The limiter drive circuit 147 is a second IC, or portion of a second IC, and is typically fabricated on a silicon chip. Damage to microwave semiconductor devices from RF overpower conditions is frequently due to thermal effects, not to junction breakdown or other voltage-related effects. Thus, the limiting action of the active limiter does not have to be instantaneous but simply fast enough to attenuate the high-power signal before it causes destructive heating of a downstream component or circuit. Even though the active limiter will be in a low-attenuation state for an initial portion of a high-power event, integrating the detector section and limiter section on a single IC, particularly using devices having very fast response times, and by having high-speed drive circuitry (e.g. limiter drive circuit 147) physically close to the active limiter IC, the active limiter can be switched to its high attenuation state sufficiently quickly to avoid damage to downstream devices.

Providing the limiter drive circuit 147 on a second IC simplifies layout of the active limiter IC 103. GaAs is relatively expensive, while differential amplifiers and comparators embedded in silicon ICs are relatively inexpensive. Generally, the more functionality in a GaAs IC, the lower the yield. Similarly, physically larger ICs yield fewer devices per substrate. Alternatively, on-chip limiter drive circuitry is provided.

Figure 1B:
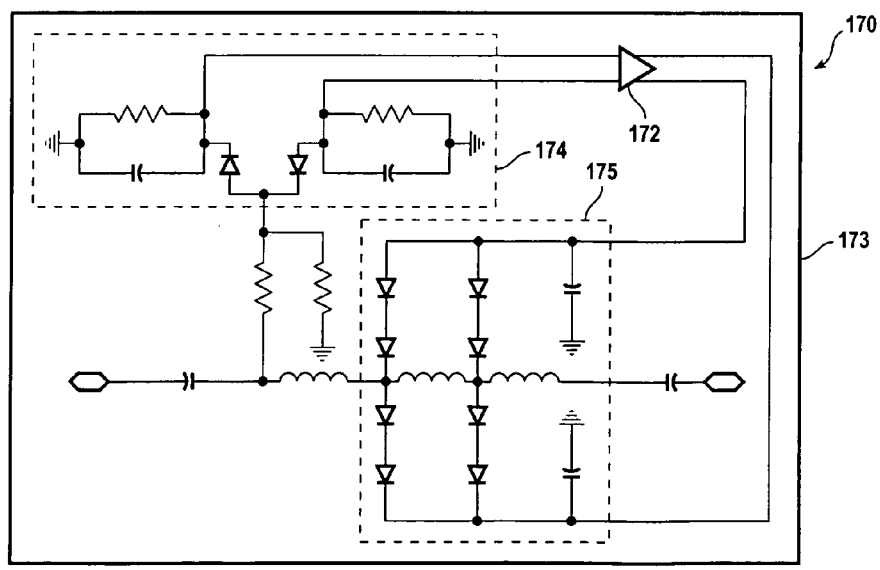
FIG. 1B shows the circuit diagram of the active limiter of FIG. 1A with an integrated differential amplifier following the detector, according to another embodiment of the invention.

FIG. 1B shows an active limiter 170 with an integrated differential amplifier 172. The active limiter is fabricated as an IC 173 on a chip of GaAs or other semiconductor. A detector section 174 and a limiter section operate substantially as described above in reference to FIG. 1A. Integrating the differential amplifier 172 on the IC 173 provides even faster switching than the embodiment of FIG. 1A for at least two reasons. First, fabricating the differential amplifier in GaAs, rather than Si, results in a faster-operating amplifier. Second, the electrical path between the detectors and the limiter diodes is very short, avoiding parasitic effects that might otherwise slow response. In an alternative embodiment, a comparator (see FIG. 2, ref. num. 260), rather than a differential amplifier, is integrated on the IC 173. A voltage reference (see FIG. 2, $V_{REF}$) is generated off of the IC 173 and coupled to the differential amplifier. In a particular embodiment, the voltage reference is user-selectable, which allows the user to limit power at different threshold levels, depending on the downstream components.

Figure 2:
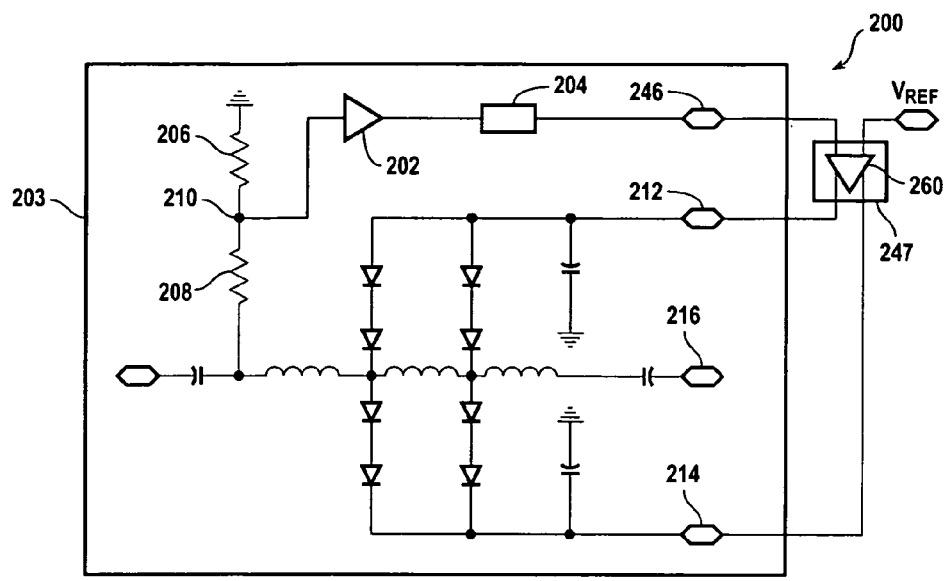
FIG. 2 shows a circuit diagram of an active limiter with an integrated amplifier preceding a detector according to another embodiment of the invention.

FIG. 2 shows a circuit diagram of an active limiter 200 with an integrated amplifier 202 preceding a detector section 204 according to another embodiment of the invention. In a particular embodiment, the amplifier 202 is a hetrojunction bipolar transistor ("HBT")—based amplifier, and the detector section 204 uses an anti-parallel pair of diodes. In alternative embodiments, other types of amplifiers and detectors are used in a GaAs IC, or in other semiconductor ICs.

In a particular embodiment, the amplifier 202 is a transistor-based amplifier in a common-emitter configuration. Emitter degeneration will typically have an impedance at the base terminal of the transistor that is higher than the RF impedance of the resistor 206. Resistor 206 forms a resistor bridge with resistor 208, so that the variation of the input impedance of the transistor due to thermal variations has only a small effect on the voltage divider ratio of resistor 208 to resistor 206. This keeps the detected RF voltage more constant over a given temperature range.

In a particular embodiment, the amplifier 202 includes a second gain stage (not shown). The second gain stage provides voltage gain to the output of the first gain stage. The output of the second gain stage provides a relatively low impedance and relatively high voltage swing. Thus, the second gain stage is used in some embodiments to drive detector diodes or other power-detection devices at a high level (relative to the level present at node 210) so that the detector device(s) can respond quickly to an overpower or overvoltage condition. The detector output is fed back to the limiter bias ports 212, 214 of the active limiter 200 to quickly set the limiter diodes to their high attenuation state and protect circuitry downstream from the output port 216.

In a particular embodiment, the detector output 246 is coupled to a limiter drive circuit 247 that includes a comparator 260. The comparator 260 compares the detector output 246 to a reference voltage $V_{REF}$ to determine whether an overvoltage or overpower event is occurring. The limiter drive circuit 247 generates limiter drive signals that are coupled to the limiter bias ports 212, 214. The reference voltage $V_{REF}$ is generated externally from the IC 203 and is coupled to the comparator 260. In a particular embodiment, the voltage reference is user-selectable, which allows the user to limit power at different threshold levels, depending on the downstream components.

A transistor-based amplifier can use its gain to drive the detector diode(s) to a sufficient amplitude to quickly provide a measurable signal indicating an overpower or overvoltage event. A smaller signal is taken from the resistive splitter formed by resistors 206, 208, and this smaller signal causes less distortion from non-linearities in the base terminal of the transistor. This allows resistor 208 to have a large resistance, which attenuates distortion products before they are fed back to the RF signal line.

Figure 3:
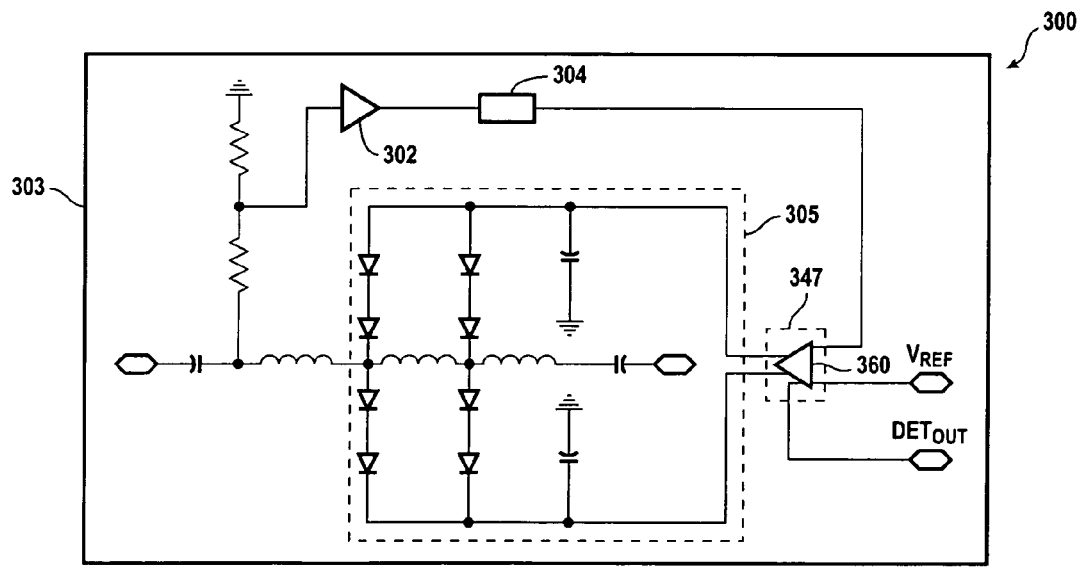
FIG. 3 shows a circuit diagram of an active limiter according to another embodiment of the invention.

FIG. 3 shows a circuit diagram of an active limiter 300 according to another embodiment of the invention. An amplifier 302, detector 304 and limiter drive circuit 347 are integrated on a GaAs IC 303. Other types of semiconductor materials and substrates are used in alternative embodiments. The limiter drive circuit 347 includes a comparator 360 that compares an output of the detector 304 to a reference voltage $V_{REF}$ that represents a maximum RF power or ESD voltage limit level.

The limiter drive circuit 347 includes an optional overpower indicator output signal $DET_{OUT}$ that indicates to an instrument display panel, system controller, or other end point, such as an indicator light, that an overpower or overvoltage event has occurred and that the limiter section 305 has been turned ON. In a particular embodiment, the limiter section 305 (and the overpower indicator output signal) is latched ON until the user or system controller resets the limiter drive circuit 347 to turn the limiter section (and overpower indicator output signal) OFF. Latching the limiter ON prevents reflected power adding ("phasing") with input power to create a null condition that the detector interprets as if the overpower event had ceased.

Overpower indicator output signals are optionally provided in other embodiments, such as the embodiments of FIGS. 1A, 1B and 2. In some embodiments, such as the embodiments of FIGS. 1A and 2, an overpower indicator output signal can be provided from the limiter drive circuit 147, 247, respectively, or can be coupled to a bias input port through a buffer, for example. Similarly, latching of the attenuator section is provided in other embodiments.

An advantage of having the detector and limiter drive circuit on the IC 303 is that the active limiter is smaller and faster to respond to an electrical overstress event. An active limiter with faster response time is particularly desirable in applications with highly sensitive downstream devices.

Figure 4:
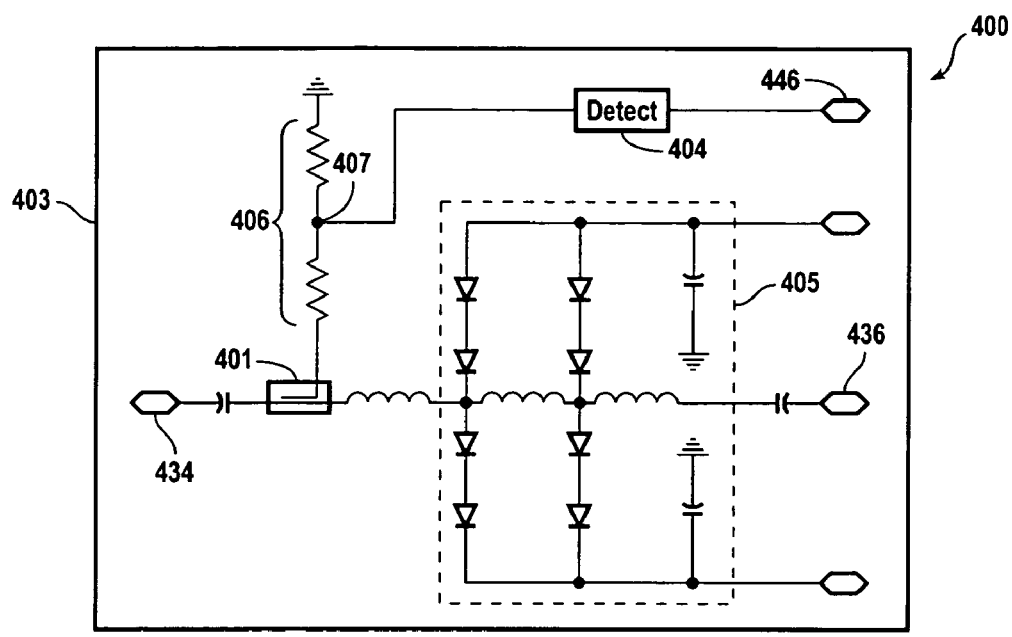
FIG. 4 is an active limiter with an on-chip directional coupler or bridge according to another embodiment of the invention.

FIG. 4 is an active limiter 400 with an on-chip directional device 401, such as a directional coupler or directional bridge, according to another embodiment of the invention. The active limiter 400 is fabricated on an IC 403, such as a GaAs IC or other semiconductor substrate. The directional device 401 couples RF power or an ESD event to the detector section 404 if the power is traveling from the RF input port 434 to the RF output port 436, but does not substantially couple RF power traveling in the reverse direction. The detector section is coupled to a node 407 of a voltage divider 406. The detector section 404 thus operates as a directional detector and the detector output 446 indicates the power traveling from the input port 434 to the output port 436, rather than the instantaneous sum of the powers traveling in each direction along the RF signal line. This avoids power reflected off the limiter section 405 (e.g. when the limiter section is ON) from adding with input power to create a null that the detector 404 interprets as a safe input condition.

Figure 5:
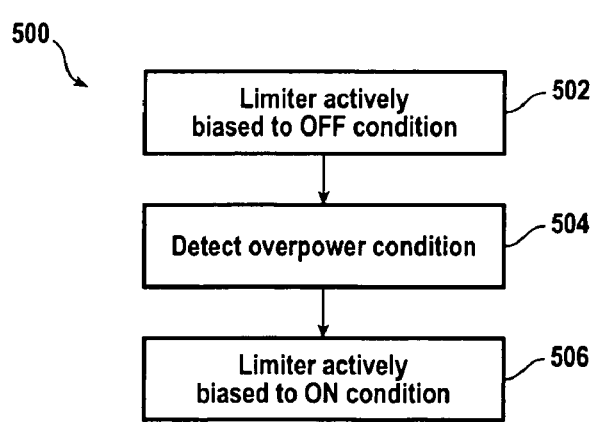
FIG. 5 is a flow chart of a method of operating a limiter circuit according to an embodiment of the invention.

FIG. 5 is a flow chart of a method 500 of operating a limiter circuit according to an embodiment of the invention. The limiter circuit has one or more diodes in a limiter section actively biased in an OFF condition so as to allow an RF signal to propagate from an RF input port to an RF output port of the limiter circuit with relatively little attenuation (step 502). When a detector integrated on an IC with the limiter section detects an overpower condition on the RF signal (step 504), a limiter drive circuit biases the one or more diodes to an ON condition (step 506) so as to attenuate the RF signal. In a further embodiment, the limiter section is biased in the ON condition until the limiter drive circuit is reset. In a yet further embodiment, an indicator signal is produced when the limiter section is biased ON or when an overpower/overvoltage condition is detected.

Embodiments provide an active limiter in a compact IC with good performance up to 20 GHz. Some embodiments can limit high-power RF signals up to 10 watts and ESD events billions of times without damage to the active limiter. The combination of a detector, limiter drive circuit (which can be on- or off-chip), and limiter section allows the limiter section to transition from a fully OFF state to a fully ON state when a high-power or ESD event is detected. This avoids operating in the soft limiting region that can otherwise cause distortion on desirable RF signals, and provides a stable impedance for the RF signal path over the operating power range.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. An integrated circuit comprising:
   a first RF port;
   a second RF port;
   a limiter section disposed between the first RF port and second RF port; and
   a detector section, coupled to the limiter section and coupled to an RF signal path between the first RF port and the second RF port, the detector section configured to detect a power level of an input signal received on an input port comprising one of the first and second RF ports, and to couple first and second detector output signals, distinct from the input signal, to first and second ports of the limiter section, causing the limiter section to limit the input signal;
   wherein the input signal may have a positive or negative voltage polarity at any instant, and wherein the difference between the first and second detector output signals at the first and second ports of the limiter section causes the limiter section to limit the input signal independently of the voltage polarity of the input signal.

2. The integrated circuit of claim 1 wherein the integrated circuit comprises a gallium-arsenide integrated circuit.

3. An integrated circuit comprising:
   a first RF port;
   a second RF port;
   a limiter section disposed between the first RF port and second RF port; and
   a detector section, coupled to the limiter section and coupled to an RF signal path between the first RF port and the second RF port, the detector section configured to detect a power level of an input signal received on an input port comprising one of the first and second RF ports, and to couple first and second detector output signals, distinct from the input signal, to first and second ports of the limiter section, causing the limiter section to limit the input signal;
   wherein the limiter section comprises a plurality of biasable switch devices switched according to the difference between the first and second detector output signals at the first and second ports of the limiter section.

4. The integrated circuit of claim 3 wherein the plurality of biasable switch devices comprises diodes.

5. An integrated circuit comprising:
   a first RF port;
   a second RF port;
   a limiter section disposed between the first RF port and second RF port; and
   a detector section, coupled to the limiter section and coupled to an RF signal path between the first RF port and the second RF port, the detector section configured to detect a power level of an input signal received on an input port comprising one of the first and second RF ports, and to couple first and second detector output signals, distinct from the input signal, to first and second ports of the limiter section, causing the limiter section to limit the input signal;
   wherein the limiter section comprises a plurality of diode stacks switched according to the difference between the first and second detector output signals at the first and second ports of the limiter section.

6. The integrated circuit of claim 1 wherein the detector section detects an RF power level of the input signal, said input signal having a frequency of at least 20 GHz.

7. The integrated circuit of claim 1 wherein the input signal detected by the detector section comprises an electrical overstress event.

8. The integrated circuit of claim 1 wherein the input signal detected by the detector section comprises an electro-static discharge ("ESD").

9. An integrated circuit comprising:
   a first RF port;
   a second RF port;
   a limiter section disposed between the first RF port and second RF port;
   a detector section, coupled to the limiter section and coupled to an RF signal path between the first RF port and the second RF port, the detector section configured to detect a power level of an input signal received on an input port comprising one of the first and second RF ports; and
   a first resistor disposed between the input port and the detector section and a second resistor disposed between the detector section and ground potential;
   wherein the first resistor is connected directly to the second resistor.

10. An integrated circuit comprising:
    a first RF port;
    a second RF port;
    a limiter section disposed between the first RF port and second RF port;
    a detector section, coupled to the limiter section and coupled to an RF signal path between the first RF port and the second RF port, the detector section configured to detect a power level of an input signal;
    a first limiter bias input port; and
    a second limiter bias input port, wherein the limiter section comprises at least a first diode disposed between the first limiter bias input port and the RF signal path and a second diode disposed between the second limiter bias input port and the RF signal path;
    and wherein bias voltages at the first and second limiter bias input ports are set according to a detector output signal.

11. An integrated circuit comprising:
    a first RF port;
    a second RF port;
    a limiter section disposed between the first RF port and second RF port;
    a detector section, coupled to the limiter section and coupled to an RF signal path between the first RF port and the second RF port, the detector section configured to detect a power level of an input signal; and a differential amplifier disposed between the detector section and the limiter section;
wherein the differential amplifier couples an amplified output signal directly to the limiter section.

12. An integrated circuit comprising:
a first RF port;
a second RF port;
a limiter section disposed between the first RF port and second RF port;
a detector section, coupled to the limiter section and coupled to an RF signal path between the first RF port and the second RF port, the detector section configured to detect a power level of an input signal;
a first resistor coupled to ground potential;
a second resistor disposed between the first resistor and the first RF port;
a node between the first resistor and the second resistor; and
an amplifier disposed between the node and the detector section;
wherein the amplifier is connected directly to the node.

13. An integrated circuit comprising:
a first RF port;
a second RF port;
a limiter section disposed between the first RF port and second RF port;
a detector section, coupled to the limiter section and coupled to an RF signal path between the first RF port and the second RF port, the detector section configured to detect a power level of an input signal;
a first limiter bias input port; and
a second limiter bias input port, wherein the limiter section comprises at least a first diode disposed between the first limiter bias input port and the RF signal path and a second diode disposed between the second limiter bias input port and the RF signal path; and
a limiter drive circuit connected to the detector section and to the first and second bias input ports, such that the first and second diodes may be switched according to an output from the limiter drive circuit.

14. The integrated circuit of claim 13 further comprising an overpower indicator output signal.

15. An integrated circuit comprising:
a first RF port;
a second RF port;
a limiter section disposed between the first RF port and second RF port;
a detector section, coupled to the limiter section and coupled to an RF signal path between the first RF port and the second RF port, the detector section configured to detect a power level of an input signal received on an input port comprising one of the first and second RF ports; and
a directional device connected to the RF signal path and to the detector section, such that it couples a portion of the input signal if the input signal travels in one direction along the RF signal path to the detector section, but does not couple any portion of the input signal if the input signal travels in the opposite direction along the RF signal path;
wherein the input signal may have a positive or negative voltage polarity at any instant, and wherein the detector section detects the power level of the input signal independently of the voltage polarity of the input signal and couples first and second detector output signals, distinct from the input signal, to first and second ports of the limiter section, the difference between the first and second signals at the first and second ports of the limiter section causing the limiter section to limit the input signal independently of the voltage polarity of the input signal.

16. The integrated circuit of claim 15 wherein the directional device is one of a directional coupler and a directional bridge.

\* \* \* \* \*